United States Patent
Ma

(10) Patent No.: US 6,549,412 B1
(45) Date of Patent: Apr. 15, 2003

(54) FIXING APPARATUS FOR HEAT SINK

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/033,261

(22) Filed: Dec. 26, 2001

(30) Foreign Application Priority Data

Dec. 12, 2001 (TW) ........................................ 90221698 U

(51) Int. Cl.⁷ .................................................. H05K 7/20
(52) U.S. Cl. ...................... 361/704; 361/707; 361/719; 361/760; 361/767; 165/80.3; 174/16.3; 257/718; 257/727
(58) Field of Search ........................ 361/687, 695–697, 361/704, 707, 709, 717–719; 174/16.3; 257/718, 719, 726, 727; 165/80.3, 185; 248/505, 510

(56) References Cited

U.S. PATENT DOCUMENTS

| | | | | |
|---|---|---|---|---|
| 5,302,853 A | * | 4/1994 | Volz et al. ................. | 257/707 |
| 5,771,559 A | * | 6/1998 | Cipolla et al. ................. | 29/453 |
| 5,870,285 A | * | 2/1999 | Kosteva et al. ............. | 165/185 |
| 6,055,159 A | * | 4/2000 | Sun .............................. | 165/185 |
| 6,058,014 A | * | 5/2000 | Choudhury et al. ......... | 257/719 |
| 6,097,601 A | * | 8/2000 | Lee .............................. | 165/122 |
| 6,151,214 A | * | 11/2000 | Yeh .............................. | 165/185 |
| 6,362,977 B1 | * | 3/2002 | Tucker et al. ............. | 174/35 R |
| 6,400,577 B1 | * | 6/2002 | Goodwin et al. ...... | 174/35 GC |
| 6,404,633 B1 | * | 6/2002 | Hsu ............................. | 24/458 |
| 6,414,848 B1 | * | 7/2002 | Chen ........................... | 165/185 |

* cited by examiner

Primary Examiner—Boris Chérvinsky
(74) Attorney, Agent, or Firm—Wei Te Chung

(57) ABSTRACT

A fixing apparatus includes a retention module (10) and a back plate (30). The retention module is attached on a motherboard (20) which defines a plurality of through apertures (22). The retention module includes a plurality of posts (12) depending therefrom. Each post defines a through hole (14) in alignment with a corresponding through aperture. The back plate is attached on an underside of the motherboard, for reinforcing the motherboard. The back plate includes a plurality of upwardly extending poles (32). The poles extend through the through apertures and the through holes to protrude from the retention module. The poles are downwardly stamped forming rivet joints between the retention module and the back plate.

14 Claims, 4 Drawing Sheets

FIXING APPARATUS FOR HEAT SINK

BACKGROUND OF THE INVENTION

1. Field of the Invention

The present invention relates to fixing apparatuses, and particularly to fixing apparatuses for heat sinks.

2. Related Art

Computer electronic devices such as central processing units (CPUs) frequently generate large amounts of heat, which can destabilize operation and cause damage. A heat sink placed in thermal contact with an electronic device transfers heat from the electronic device through conduction.

A conventional heat sink assembly comprises a heat sink and a fixing apparatus for attaching the heat sink to a motherboard. The fixing apparatus comprises a retention module, a back plate and a plurality of clips. In assembly, the retention module is securely attached on the motherboard with rivets, for facilitating attachment of the heat sink to the motherboard. The back plate is located below the motherboard with the clips, for reinforcing the motherboard. The heat sink is then fixed to the motherboard with the clips. In this procedure, the retention module and the back plate must be sequentially attached to the motherboard. The assembly process is unduly complicated and time-consuming. Furthermore, additional rivets and clips are needed to fix the retention module and the back plate to the motherboard. This unduly inflates costs.

It is strongly desired to provide an improved fixing apparatus which overcomes the above problems.

SUMMARY OF THE INVENTION

Accordingly, an object of the present invention is to provide a fixing apparatus which comprises a retention module and a back plate secured to a motherboard simultaneously.

To achieve the above-mentioned object, a fixing apparatus in accordance with the present invention comprises a retention module and a back plate. The retention module is attached on a motherboard which defines a plurality of through apertures. The retention module comprises a plurality of posts depending therefrom. Each post defines a through hole in alignment with a corresponding through aperture. The back plate is attached on an underside of a motherboard, for reinforcing the motherboard. The back plate comprises a plurality of upwardly extending poles. The poles extend through the through apertures and the through holes to protrude from the retention module. The poles are downwardly stamped forming rivet joints between the retention module and the back plate.

Other objects, advantages and novel features of the present invention will be drawn from the following detailed description of a preferred embodiment of the present invention with attached drawings, in which:

DESCRIPTION OF THE PREFERRED EMBODIMENT

Figure 1:
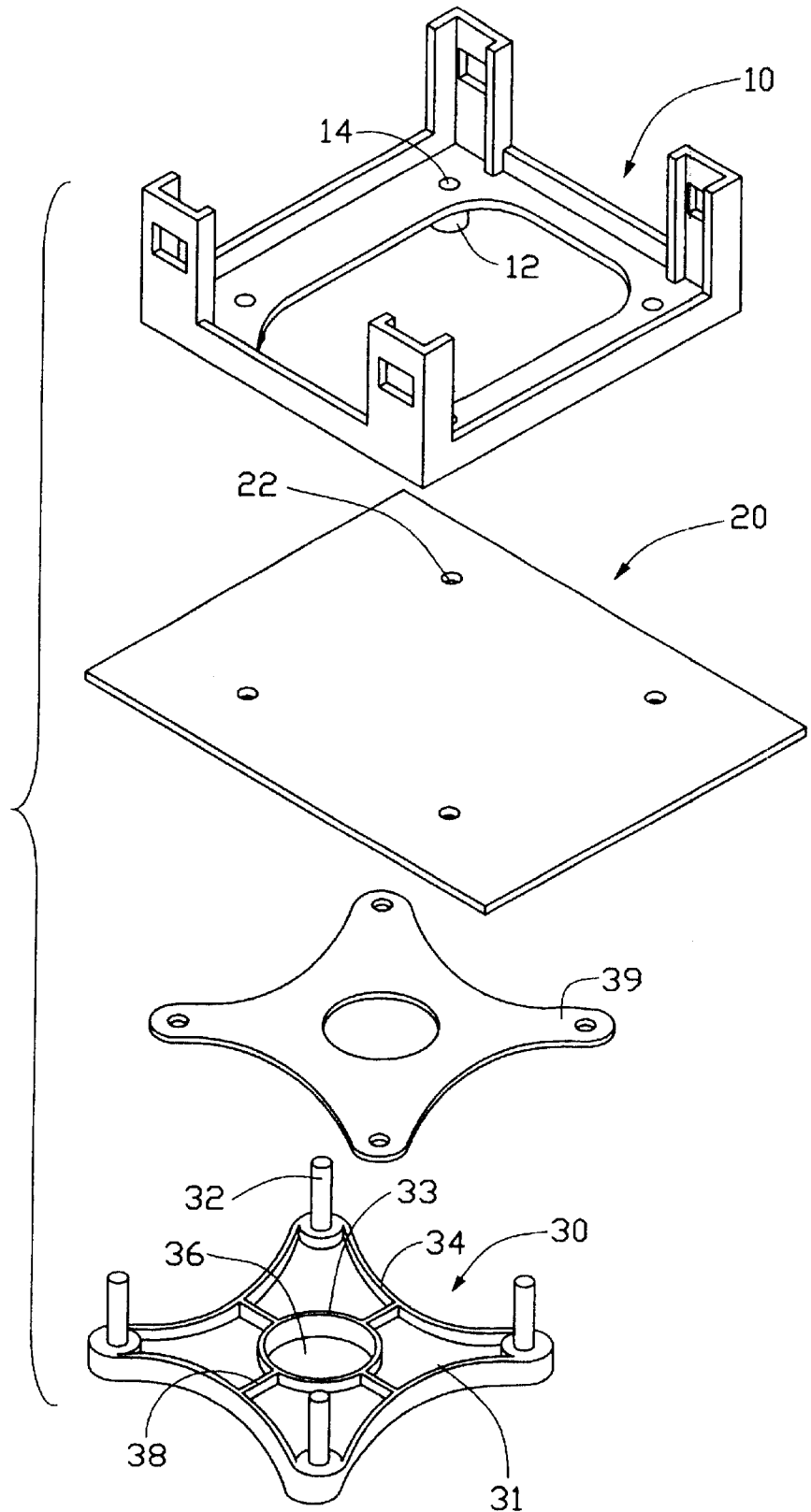
FIG. 1 is an exploded perspective view of a fixing apparatus in accordance with the present invention, together with a motherboard.

Referring to the attached drawings, FIG. 1 shows a fixing apparatus in accordance with the present invention together with a motherboard 20. The fixing apparatus comprises a rectangular retention module 10, and a back plate 30. The motherboard 20 defines four through apertures 22. A region of the motherboard 20 surrounded by the apertures 22 is used to support a central processing unit (CPU) socket (not shown) and a CPU (not shown) on the socket.

The retention module 10 is for attaching on the motherboard 20 and thereby retaining a heat sink (not shown) in contact with the CPU on the motherboard 20. Four posts/standoffs 12 depend from the retention module 10 respectively adjacent four corners thereof. Each post 12 defines a through hole 14 therein, corresponding to a through aperture 22 of the motherboard 20. Four upstanding retention walls 11 formed around the four corners with a retention holes 13 respectively for latch engagement with the corresponding heat sink clips (not shown). An central opening 18 is defined for receiving the CPU socket therein.

The back plate 30 is for reinforcing the motherboard 20. The back plate 30 is made of metal, and comprises a base 31. Four evenly spaced poles 32 extend upwardly from a periphery of the back plate 30, corresponding to the through apertures 22 of the motherboard 20 and the through holes 14 of the retention module 10. A height of each pole 32 is slightly greater than a combined depth of the corresponding through aperture 22 of the motherboard 20 plus depth of the corresponding through hole 14 of the retention module 10. An opening 36 is defined in a center of the base 31, for facilitating elastic deformation of the base 31. A first flange 33 is formed on the base 31 around the opening 36. Second flanges 34 are formed on peripheries of the base 31. A plurality of ribs 38 is formed on the base 31. Each rib 38 connects between the first flange 33 and a second flange 34. The flanges 33,34 and the ribs 38 reinforce the base 31.

Figure 2:
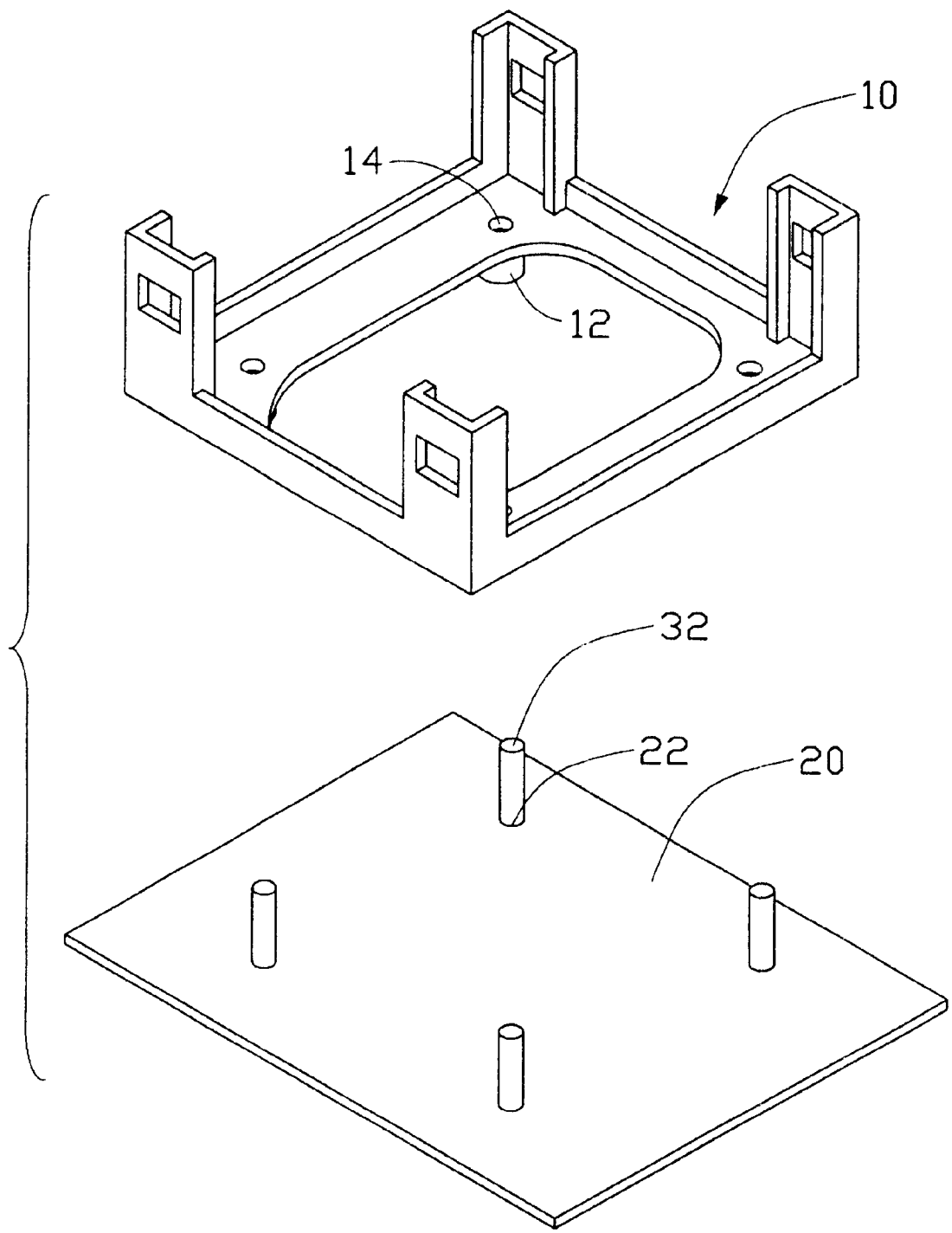
FIGS. 2–4 are perspective views showing progressive stages of assembly of the fixing apparatus and motherboard of FIG. 1.
Figure 3:
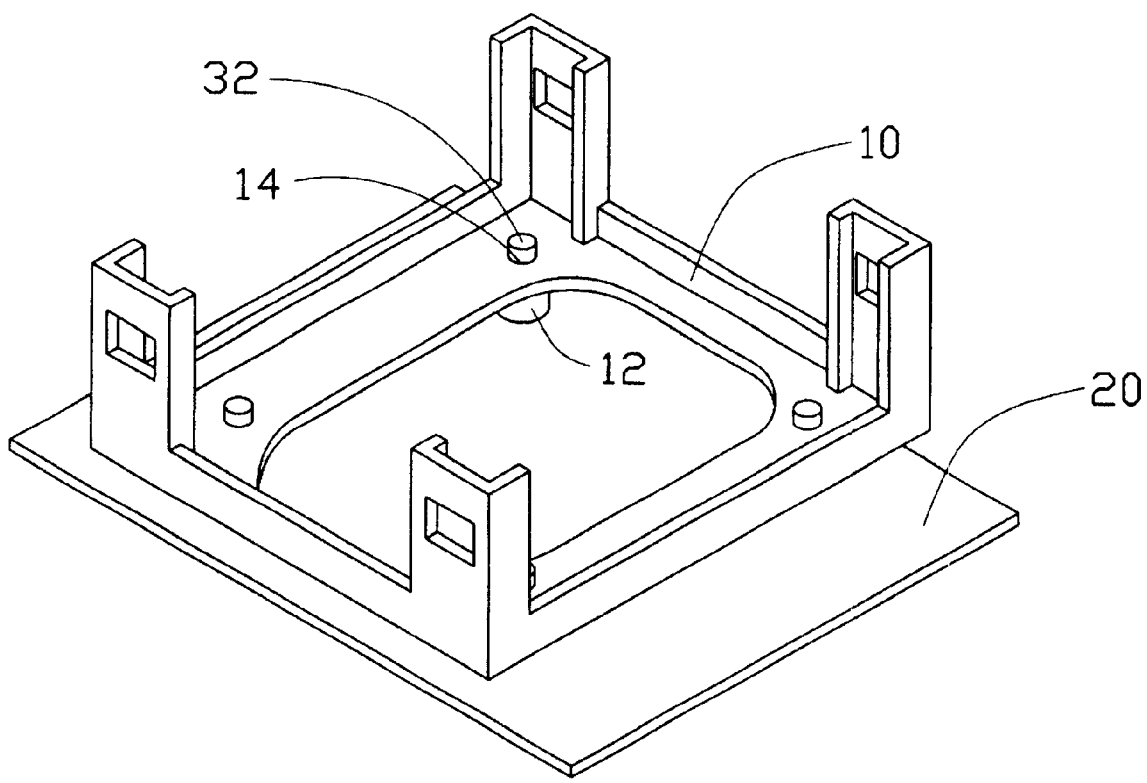
Figure 4:
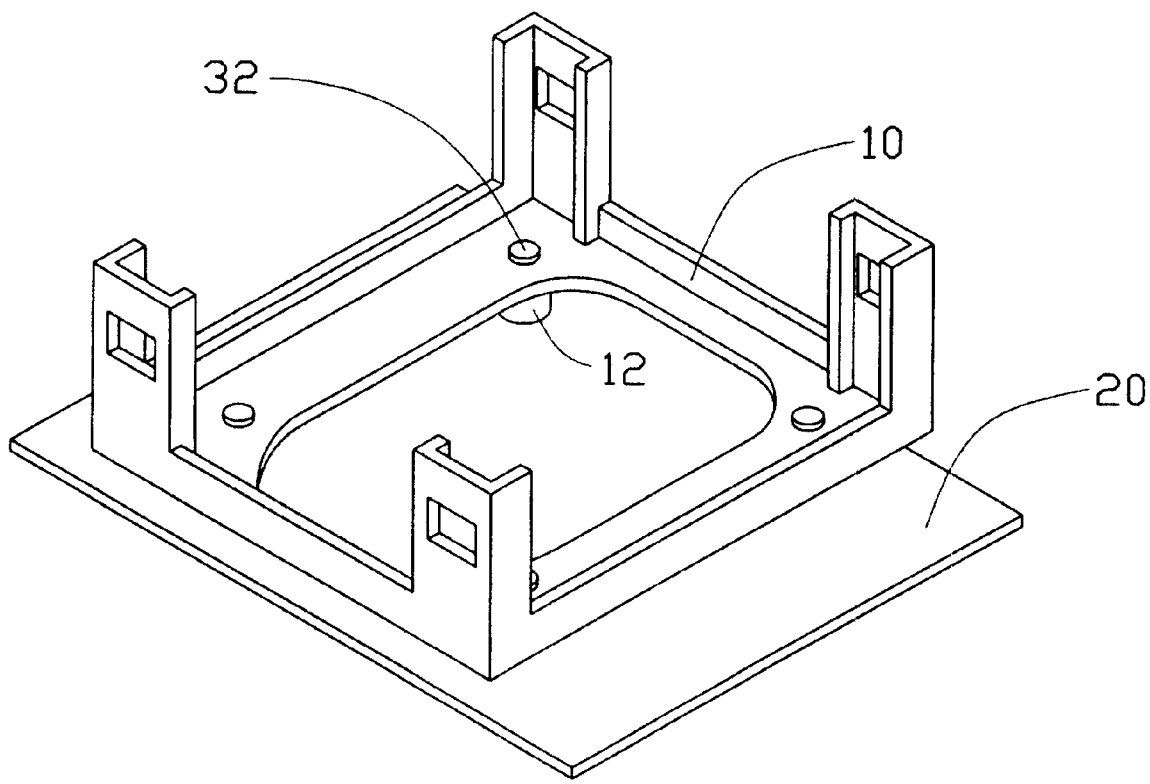

Referring also to FIGS. 2–4, in assembly, a layer of insulator 39 is attached on a top surface of the base 31 of the back plate 30. The combined insulator and back plate 30 is attached to an underside of the motherboard 20. The poles 32 of the back plate 30 are extended through the through apertures 22 of the motherboard 20. The retention module 10 is then attached to a top side of the motherboard 20 opposite to the back plate 30. The posts 12 of the retention module 10 abut a top face of the motherboard 20. The poles 32 of the back plate 30 are further extended through the through holes 14 of the posts 12 to protrude from the retention module 10. The poles 32 are then stamped to thereby form rivet joints between the retention module 10 and the back plate 30. The fixing apparatus is thus attached on opposite sides of the motherboard 20. The layer of insulator 39 located between the back plate 30 and the motherboard 20 facilitates tight engagement between the back plate 30 and the retention module 10, and prevents electrical connection from occurring between the back plate 30 and circuits on the motherboard 20.

In the present invention, the retention module 10 and the back plate 30 are simultaneously secured to the motherboard 20 by stamping the poles 32 to form rivet joints between the retention module 10 and the back plate 30. This is a very fast operation. In addition, no rivets are needed, thereby reducing costs.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A fixing apparatus assembly comprising:

a motherboard defining a plurality of through apertures;

a back plate attached on an underside of the motherboard to reinforce the motherboard, the back plate comprising a plurality of poles; and a retention module attached on top of the motherboard, the retention module defining a plurality of through holes in alignment with the through apertures respectively, wherein the poles extend through the through apertures and the through holes to protrude from the retention module, and the poles are stamped thereby forming fixed rivet joints between the retention module and the back plate.

2. The fixing apparatus assembly as claimed in claim 1, wherein the retention module comprises a plurality of posts depending therefrom, and the through holes are defined in the posts respectively.

3. The fixing apparatus assembly as claimed in claim 1, wherein the back plate comprises a base, and the poles extend upwardly from the base.

4. The fixing apparatus assembly as claimed in claim 3, wherein the base defines an opening therein for facilitating elastic deformation of the base.

5. The fixing apparatus assembly as claimed in claim 4, wherein flanges are formed on peripheries of the base and around the opening, for reinforcing the base.

6. The fixing apparatus assembly as claimed in claim 5, wherein the base further forms a plurality of ribs thereon for reinforcing the base.

7. The fixing apparatus assembly as claimed in claim 1, wherein a layer of insulator is located between the motherboard and the back plate, for preventing electrical connection between the back plate and circuits on the motherboard.

8. A method for securing a fixing apparatus to a motherboard which defines a plurality of through apertures, the method comprising the steps of:

a) providing a back plate having a plurality of poles extending upwardly therefrom;

b) providing a retention module defining a plurality of through holes therein;

c) attaching the back plate to an underside of the motherboard, with the poles extending through the through apertures respectively;

d) attaching the retention module to a top side of the motherboard, the poles further extending through the through holes respectively to protrude from the retention module; and e) stamping the poles to form fixed joints between the retention module and the back plate.

9. The method as claimed in claim 8, wherein the retention module comprises a plurality of posts depending therefrom, and the through holes are defined in the posts respectively.

10. The method as claimed in claim 8, wherein the back plate comprises a base, and the poles extend upwardly from the base.

11. The fixing apparatus assembly as claimed in claim 10, wherein the base defines an opening therein for facilitating elastic deformation of the base.

12. The fixing apparatus assembly as claimed in claim 11, wherein flanges are formed on peripheries of the base and around the opening, for reinforcing the base.

13. The fixing apparatus assembly as claimed in claim 12, wherein the base further forms a plurality of ribs thereon for reinforcing the base.

14. The fixing apparatus assembly as claimed in claim 8, wherein step d) further comprises the step of: attaching a layer of insulator on the back plate before the back plate is attached to the motherboard, for preventing electrical connection between the back plate and circuits on the motherboard.

* * * * *